United States Patent [19]

Meyer et al.

[11] Patent Number: 5,361,021
[45] Date of Patent: Nov. 1, 1994

[54] METHOD FOR SUPPRESSING CURRENT PEAKS DURING COMMUTATION OF A BRUSHLESS DIRECT-CURRENT MOTOR

[75] Inventors: Helmut Meyer, Weinheim; Kai Albrecht, Heidelberg; Jürgen Seeberger, Walldorf, all of Germany

[73] Assignee: Heidelberger Druckmaschinen AG, Heidelberg, Germany

[21] Appl. No.: 912,051

[22] Filed: Jul. 7, 1992

Related U.S. Application Data

[63] Continuation of Ser. No. 674,507, Mar. 22, 1991, abandoned.

[30] Foreign Application Priority Data

Mar. 22, 1990 [DE] Germany ........................... 4009184

[51] Int. Cl.$^5$ ........................ H02P 6/02; H02K 29/06
[52] U.S. Cl. ..................................... 318/254; 318/439
[58] Field of Search ............... 318/138, 254, 439, 445, 318/452, 453, 454, 455, 484

[56] References Cited

U.S. PATENT DOCUMENTS

| | | | |
|---|---|---|---|
| 3,942,083 | 3/1976 | Takahashi et al. | 318/138 |
| 4,167,693 | 9/1979 | Liska et al. | 318/138 |
| 4,329,636 | 5/1982 | Uchida et al. | 318/254 X |
| 4,368,411 | 1/1983 | Kidd | 318/254 |
| 4,473,781 | 9/1984 | Nielsen | 318/254 |
| 4,507,590 | 3/1985 | Miyazaki | 318/254 |
| 4,514,667 | 4/1985 | Sakmann et al. | 318/254 |
| 4,558,264 | 12/1985 | Weischedel | 318/254 |
| 4,565,957 | 1/1986 | Gary et al. | 318/723 |
| 4,636,932 | 1/1987 | Kurosawa et al. | 363/54 |
| 4,687,977 | 8/1987 | Brahmavar et al. | 318/492 |
| 4,700,116 | 10/1987 | Inoue et al. | 318/254 |
| 4,743,815 | 5/1988 | Gee et al. | 318/138 |
| 4,752,724 | 6/1988 | Radziwill et al. | 318/254 |
| 4,760,315 | 7/1988 | Nanae et al. | 318/254 |
| 4,851,763 | 7/1989 | Grützmacher . | |
| 4,874,993 | 10/1989 | Tanaka et al. | 318/254 |

OTHER PUBLICATIONS

IEEE Transactions on Industry Application vol. 25, No. 3 May/Jun. 1989, p. 441 to 450 (Yoshihiro Murai et al.).

*Primary Examiner*—Bentsu Ro
*Attorney, Agent, or Firm*—Herbert L. Lerner; Laurence A. Greenberg

[57] ABSTRACT

A method for suppressing current peaks occurring during commutation in phase windings of a brushless direct-current motor, including supplying the phase windings via an indirect direct-current converter with rectangular current having an actual value measured exclusively in a direct-current link of the converter (single-current measurement), and delaying current buildup in the phase winding by a time period $t_v$ with respect to a current decay.

10 Claims, 5 Drawing Sheets

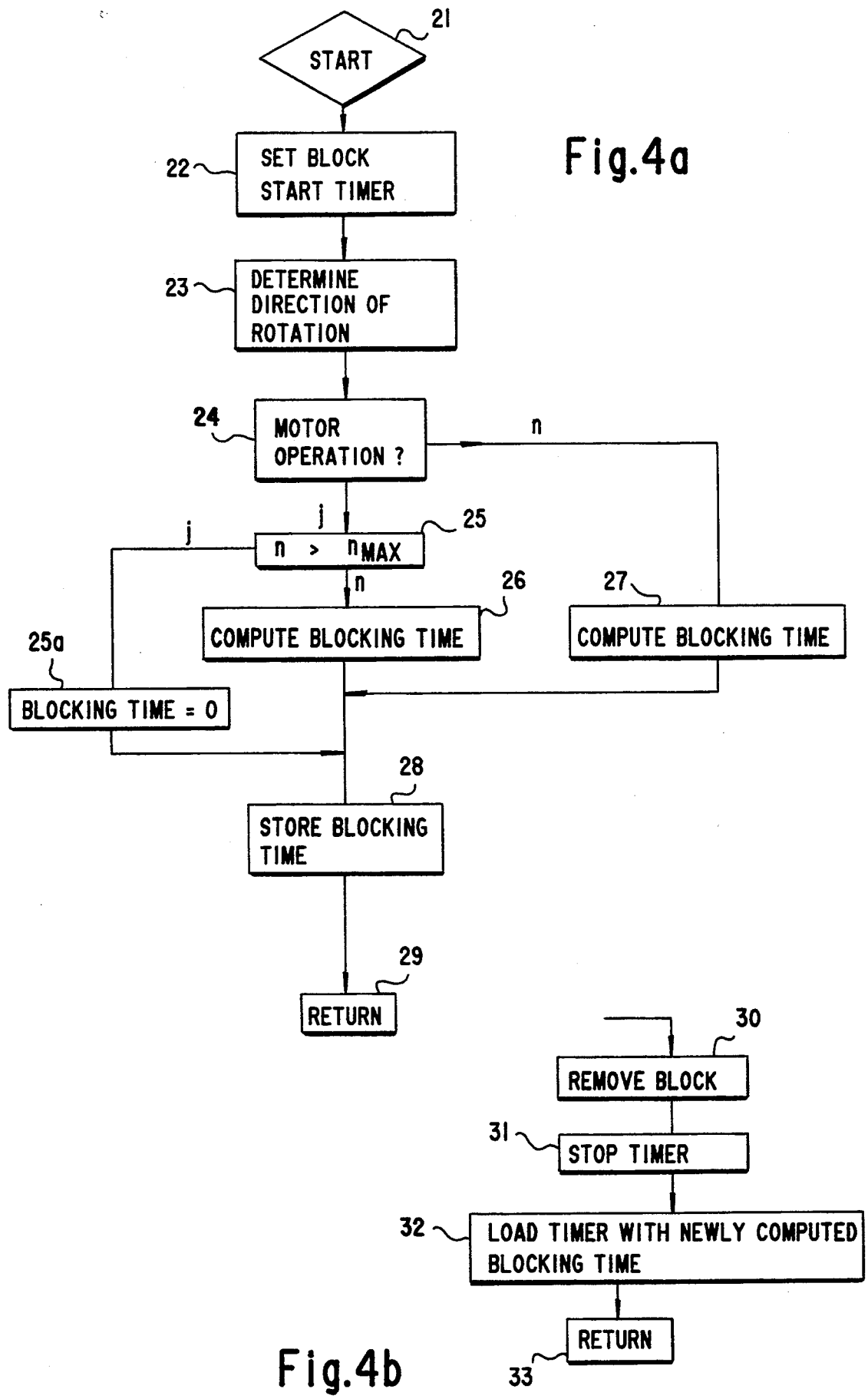

METHOD FOR SUPPRESSING CURRENT PEAKS DURING COMMUTATION OF A BRUSHLESS DIRECT-CURRENT MOTOR

This application is a continuation of application Ser. No. 674,507, filed Mar. 22, 1991, now abandoned.

The invention relates to a method for suppressing current peaks occurring during commutation in phase windings of a brushless direct-current motor if the phase windings are supplied with rectangular or square-wave current via an indirect direct-current converter (converter) and if the actual value of the current is measured exclusively in a direct-current link or intermediate circuit (single-current measurement).

There are two possible ways of measuring the motor current so as to obtain an actual value thereof for current regulation in an electronically commutated direct-current motor:

a) by single-current measurement in the direct-current link, the alternating current flowing in the link being identical with the motor current; and b) by multiple-current measurement, wherein the currents which actually flow in the phase windings are measured in the motor supply leads.

A device suitable for current measurement has been described heretofore in German Published Non-Prosecuted Application (DE-OS) 37 08 892 wherein current measurement for determining the motor current of a direct-current motor is described as being performed in an isolated circuit by means of a contactless current sensor and by means of an evaluation device located downline of the sensor, the evaluation device supplying an output signal proportional to the measured current. In order to increase the accuracy of the measured values, zero drifts of the current sensor and of the evaluation device, respectively, are compensated for via a feedback-control circuit.

Both single, as well as, multiple-current measurements have disadvantages. In the case of multiple-current measurements, the disadvantage lies in the additional financial outlay which is required because, instead of one measuring device as is used for single-current measurement, it is necessary to connect separate measuring devices into each phase winding. In the case of multiple-current measurements, also, an additional measuring device should continue to measure the current in the direct-current link, so that it is possible immediately to detect the short-circuit current and to switch off the power section if there is a defect in the transistors of the power section. The expense required for and the level of sophistication offered in multiple-current measurement, however, ensure that the measured actual value of the current is always identical with the motor current.

This is not the case with single-current measurement in the direct-current link or intermediate circuit. Current peaks occur in the motor during commutation. These current peaks are caused by the varying buildup and decay times of the current in the phase windings during commutation. Because the buildup of current in the commutating phase winding, except for the upper rotational-speed range in the motor mode, takes place throughout considerably faster than the decay of current in the off-commutating phase winding, and current flows in all phase windings of the direct-current motor during commutation. This excess of current in the motor is not detected by single-current measurement in the direct-current link. Consequently, current regulation during commutation is based on an incorrect or false actual value of the current.

The height or level of the current peak is dependent upon the instantaneous value of the current, the rotational speed, the respective state of the current controller, i.e., on or off, and on the operating mode of the motor, i.e. motor or generator, at most twice the rated current being able to flow in the motor. A disadvantage, in this connection, is that the power electronics and motor must be designed for this double rated current, which leads to overdimensioning of the drive and thus likewise to increased costs.

Proceeding from this state of the prior art, it is an object of the invention to provide a method for suppressing current peaks occurring during commutation in phase windings of a brushless direct-current motor which initially measures the motor current in an economical manner by means of single-current measurement in the direct-current link and, then, suppresses the current peaks which occur in the motor during commutation.

With the foregoing and other objects in view, there is provided, in accordance with the invention, a method for suppressing current peaks occurring during commutation in phase windings of a brushless direct-current motor, which comprises supplying the phase windings via an indirect direct-current converter with rectangular current having an actual value measured exclusively in a direct-current link of the converter, and delaying current buildup in the phase winding by a time period $t_v$ with respect to a current decay.

In accordance with another mode of the method invention, the method includes initiating the current decay at an instant of time relative to an arrival of a commutation signal from a rotor-position sensor, and initiating the current buildup with a delay of the time period $t_v$.

The method according to the invention advantageously encompasses two possible variants. Because the current peak is a direct consequence of commutation or, more accurately, of the varying current-buildup and current-decay times in the phase windings during commutation, the instant of arrival of a commutation signal from a rotor-position sensor is employed as a reference point for the time shift between current buildup and current decay.

Thus, in accordance with the invention, as a first alternative, the method includes initiating the current decay upon arrival of a commutation signal from a rotor-position sensor, and initiating the current buildup with a delay of the time period $t_v$.

Further in accordance with the invention, as a second alternative, the method includes initiating the current decay prior to arrival of a commutation signal from a rotor-position sensor, and initiating the current buildup with a delay of the time period $t_v$ upon arrival of the commutation signal.

In accordance with another mode of the invention applicable to both alternatives, the method includes blocking a current controller during the time period $t_v$ = blocking time $t_s$.

When the current controller is blocked at the instant of commutation (the first alternative) or at time $-t_v$ prior to arrival of the commutation signal (the second alternative), all switchable semiconductor valves are switched off. This mode or measure ensures that the current decay is initiated immediately and, furthermore, that it is accelerated, because the back-e.m.f. is greater.

In accordance with a further mode of the invention, the method includes selecting a blocking time $t_s$ = the time period tv by an electronic control, and blocking a current controller during the time period $t_v = t_s$. For the computed blocking time $t_s$, the electronic control electronics thus supplies a blocking signal to the current controller. After the expiration of the blocking time $t_s$, the current controller is switched on again in accordance with the control signals of the control logic of the converter present at the driver stage. An advantage of this construction is that it is thereby possible optimally to determine the blocking time.

A desirable further development of the method according to the invention relates to this optimization of the blocking time $t_s$. For this purpose, in accordance with an additional measure or mode of the invention, the method includes determining the blocking time $t_s$ from current-buildup and current-decay characteristics so that the current buildup and the current decay are completed substantially simultaneously.

The current-buildup and current-decay characteristics are stored in the electronic control as a function of rotational speed and operating mode (motor/generator). For conventional parameters (rotational speed, operating mode), the electronic control computes the lengths of time after which current buildup is completed in the commuting phase winding (I = motor current), and current decay is completed in the off-commutating phase winding (I = 0). The difference between the computed current-buildup and current-decay times corresponds to the blocking time $t_s$ of the current controller. The blocking time $t_s$, therefore, is variable as a function of rotational speed, operating mode and motor current.

This method according to the invention, ensures an optimal determination of the blocking time, because the occurrence of current peaks is completely suppressed. Conversely, the delay in commutation is kept to a minimum, which has a desirable effect upon the stability or constancy of the torque, because the dips or inroads in the motor current remain minimal.

A mode of the inventive method which is rather simple to realize is for the blocking time $t_s$ to be constant. In such a case, the blocking time can be selected or prescribed likewise by an electronic control superposed on the current controller by means of a program; however, it can also be realized by hardware with a rather small outlay for circuitry.

In accordance with an added mode or measure of the invention, the method includes blocking the converter upon the arrival of the commutation signal, and initiating commutation when the motor current reaches a minimum $I_{min}$. In the case of a two-position controller, the direction of the current in the link or intermediate circuit changes whenever the current reaches the upper or lower limit value of the hysteresis band of the current controller. The magnitude of the allowable deviations from the current setpoint (= mean value of the hysteresis) is variable and can be set at the current controller. It is advantageous to initiate commutation after a time period $t_v$, when the motor current has reached the lower hysteresis limit value after the arrival of the commutation signal. This measure also ensures the start of the method includes blocking the converter upon the arrival of the commutation signal, and initiating commutation when the motor current reaches a minimum $I_{min}$.

In accordance with a concomitant measure of the invention, the method includes maintaining the current controller in unblocked condition above a given rotational speed in a motor mode. Consequently, current buildup and current decay start as usual at the instant of commutation. This measure takes into account that, in the upper rotational-speed range in the motor mode, current decay terminates faster than current buildup. In this case, a prior initiation of current decay in relation to current buildup would lead to dips in the motor current and thus to increased torque ripple.

Other features which are considered as characteristic for the invention are set forth in the appended claims.

Although the invention is illustrated and described herein as embodied in a method for suppressing current peaks during commutation of a brushless direct-current motor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 3A:
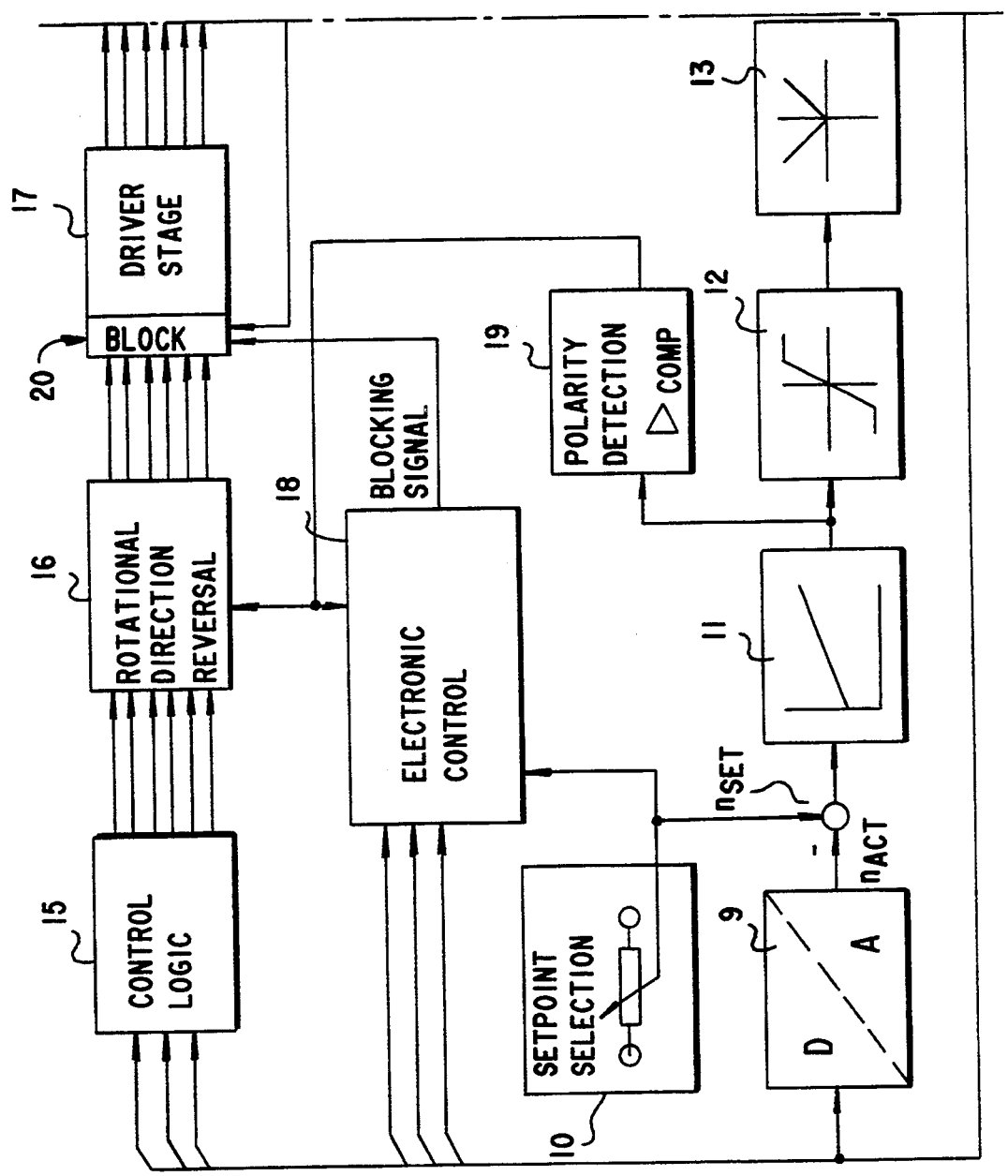
Figure 3B:
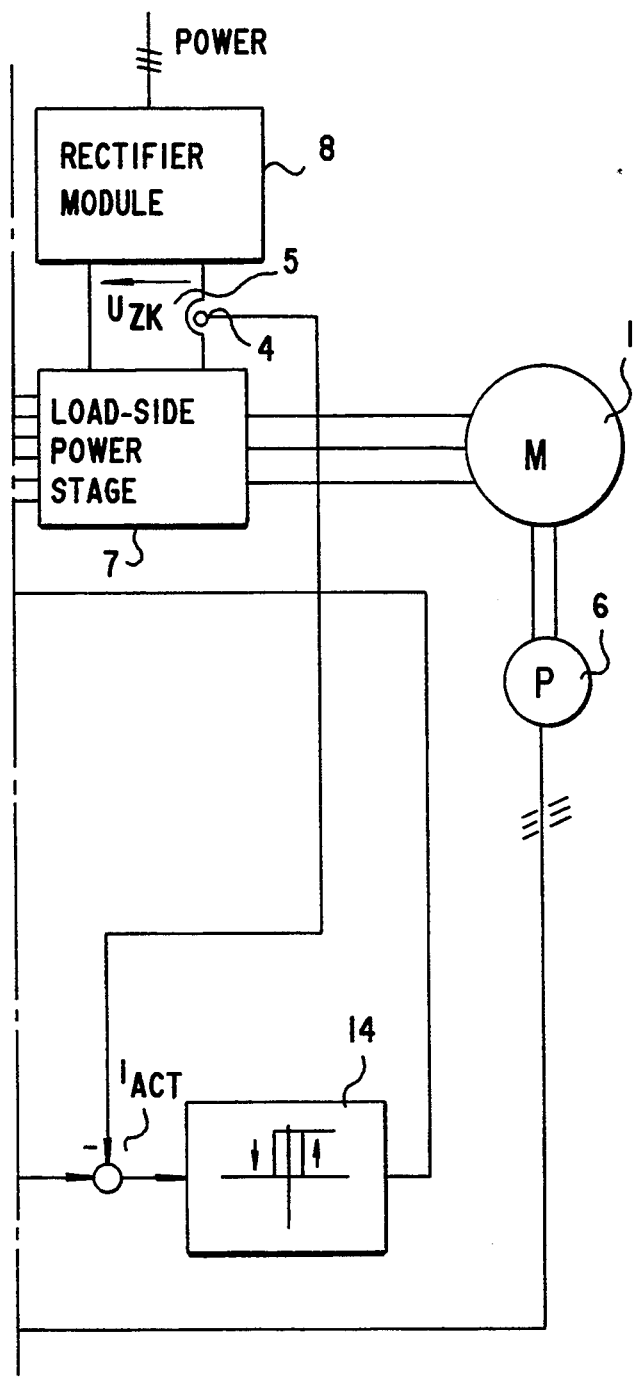

FIGS. 3a and 3b together constitute a block diagram of a direct-current drive for performing the method according to the invention;

FIG. 4a is a flow chart of a program for the electronic control system of FIG. 3a for activating the block; and FIG. 4b is a flow chart of an interrupt process for the timer of the electronic control system.

Figure 1A:
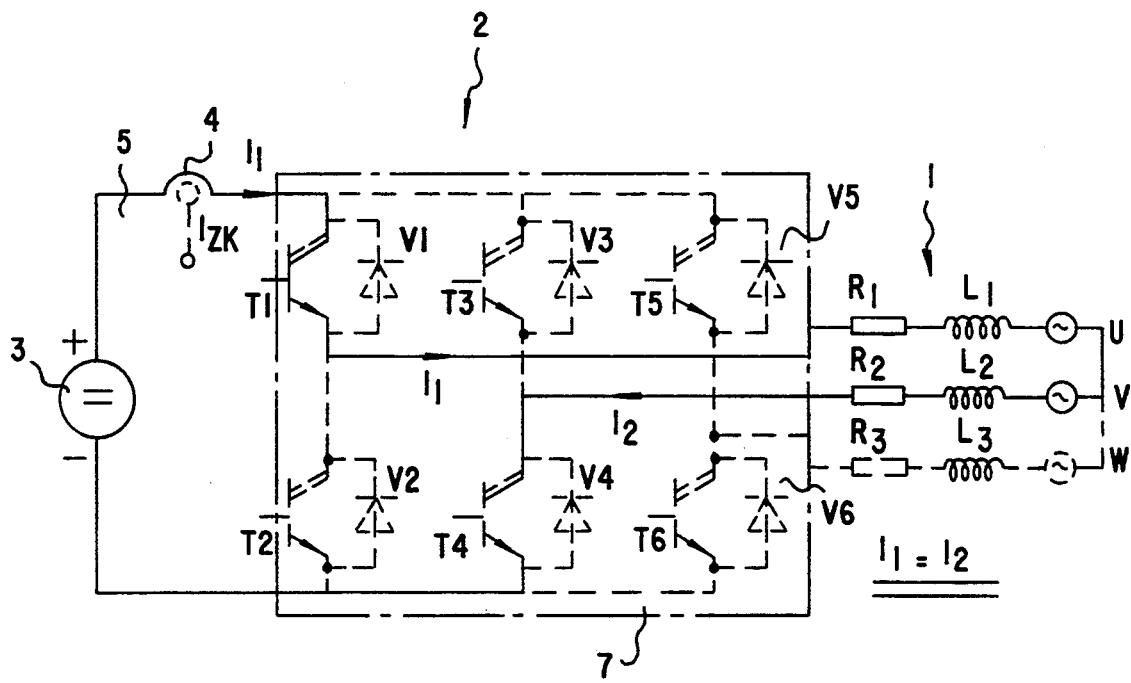
FIG. 1a is a circuit diagram depicting the current path in a load-side power section of a converter prior to commutation.
Figure 1B:
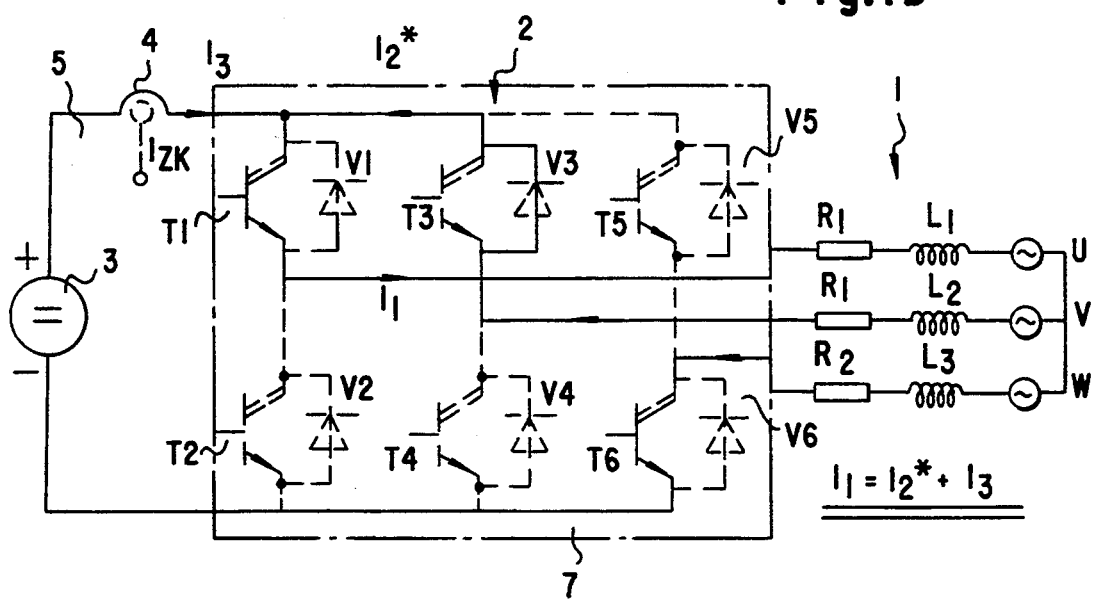
FIG. 1b is a circuit diagram depicting the current path in a load side power section of a converter during commutation.

Referring now to the drawings and, first, particularly, to FIGS. 1a and 1b, there is shown therein a load-side power section of a converter 2 of a three-phase direct-current motor 1. Inductances L1, L2 and L3 and ohmic resistances R1, R2 and R3 of phase windings U, V and W are shown. The phase windings U, V and W are connected in a conventional manner to the converter 2 which is electronically controllable by switchable semiconductor valves or power switch (e.g. power transistors T1 to T6). Free-wheeling diodes V1 to V6 are connected antiparallel or back-to-back with the semiconductor valves or power transistors T1 to T6. A line-side converter and an intermediate-circuit or link capacitor, not shown in FIG. 1, are replaced, in the interest of simplicity, by a direct-current source 3.

A motor current $I_i$ (i = 1,2,3) is measured by means of a current-measuring device 4, which is disposed in the direct-current intermediate circuit or line 5 between a rectifier module 8 (FIG. 3b) of the converter 2 and a controllable, load-side power stage 7 of the converter 2. As has been mentioned hereinbefore, the magnitude of the current in the direct-current intermediate circuit or link 5 corresponds to the motor current $I_i$. This condition does not apply during commutation, however.

FIG. 1a shows the motor currents $I_i$ prior to commutation. A current $I_1=I_2$ flows through the energized transistors T1 and T4; measured current and motor current are identical. Consequently, the precise actual value of the current is available for current regulation.

During commutation from the phase winding V to the phase winding W, according to FIG. 1b, the power transistor T4 is blocked and the power transistor T6 is switched to the conducting state. The inductance L2 of the phase winding V counteracts a spontaneous change in current and the current $I_2{}^*$ flows via the free-wheeling diode V3 and the still-energized power transistor T1 into the phase winding U without being detected by the current-measuring device 4 in the direct-current intermediate circuit or link 5. A spontaneous current buildup of the commutating phase winding W is, of course, counteracted also by the inductance L3 but, over broad rotational-speed ranges, the current buildup is faster than the current decay in the off-commutating phase winding V. During commutation, current thus flows in all three phase windings U, V and W, no measurement of the current $I_2{}^*$ being taken in the branch which is, in fact, in the process of off-commutating. An incorrect or false actual value of the current $I_3$ is fed to the current controller.

Figure 2:
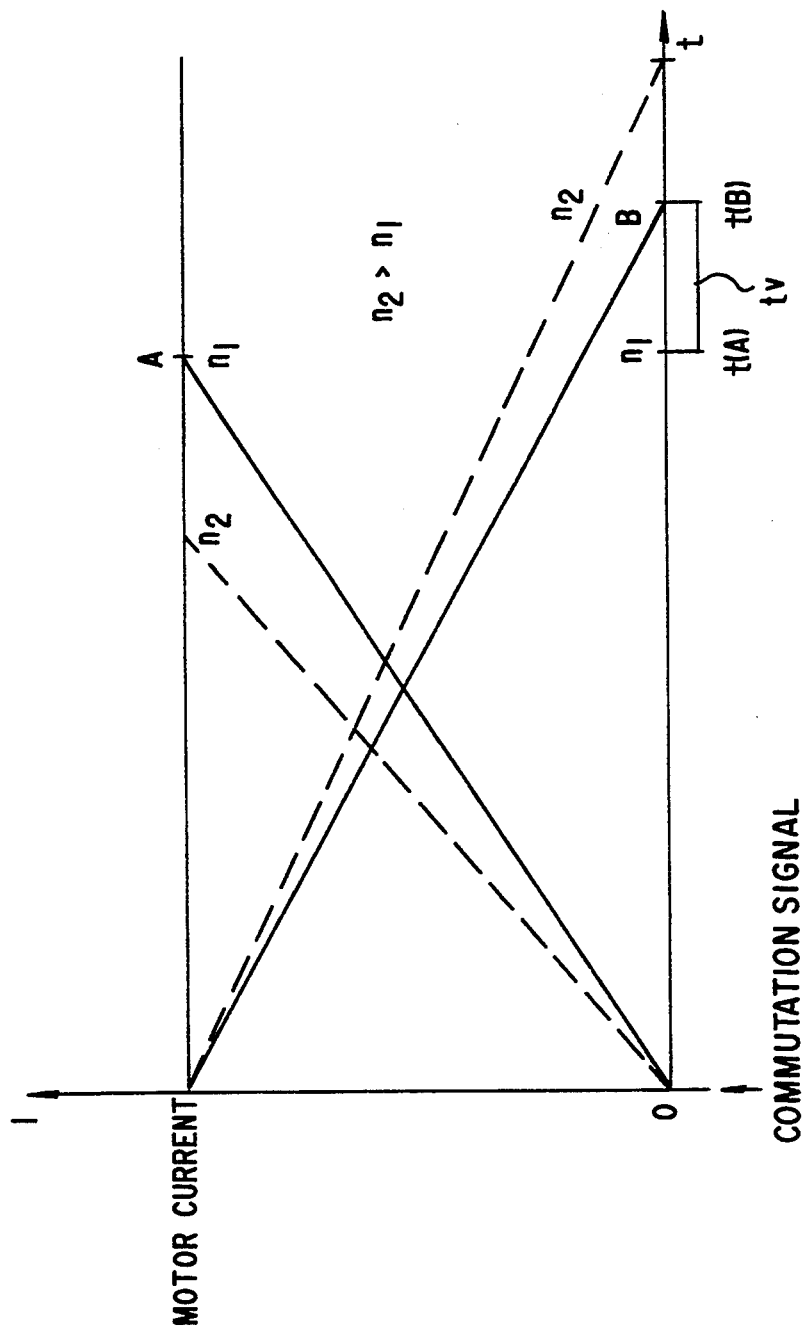
FIG. 2 is a plot diagram representing rotational-speed and operating mode-dependent current buildup and current-decay characteristics for generator-mode operation with a sketch for determining blocking time $t_s$ for a rotational speed n1.

FIG. 2 is a plot diagram of the rotational speed and operating mode-dependent current-buildup and current-decay characteristics (time rate of change of the current) in the phase windings of a brushless direct-current motor 1 after commutation. Current buildup and current decay are exponential. Because the time constant $\gamma_i = L_i/R_i$, wherein $L_i$ is inductance and $R_i$ is ohmic resistance or resistivity of a phase winding, is much greater than the time t between two commutations, the current-buildup and current-decay characteristics are, in a first approximation, straight lines having opposite slopes. The slope of the characteristics (rate of current rise) is dependent upon the operating mode (motor/generator) and upon the rotational speed of the direct-current motor 1. FIG. 2 shows current-buildup characteristics (solid lines) and current-decay characteristics (broken lines), for example, for the generator mode. The slope of the current-buildup characteristics becomes greater with rising rotational speed n (n2>n1), while the slope of the current-decay characteristics decreases with increasing rotational speed n. Across the entire relevant rotational-speed range, therefore, the current buildup is completed faster than the current decay. As a consequence thereof, peaks occur in the motor current which are not detected by single-current measurement in the direct-current link or intermediate circuit.

Additionally, FIG. 2 illustrates, with reference to the current-buildup and current-decay characteristics at the rotational speed $n_1$, the determination of a blocking time $t_s$ of the current controller 14 in accordance with a mode of the method for uncontrolled operation in accordance with the invention. If current buildup and current decay are initiated simultaneously upon arrival of the commutation signal, the current buildup in the commutating phase winding (attainment of the motor current at a point A) is completed faster than the current decay in the off-commutating phase winding (attainment of the current value I=0 at a point B). If, as provided in another mode or variation of the method according to the invention, however, the current buildup is delayed in relation to the current decay by the difference in the current-decay time and the current-buildup time $(t(B)-t(A)=t_v=t_s)$, then the current buildup is completed approximately simultaneously with the current decay at the point B. The current peak during commutation which occurs because of single-current measuring is completely eliminated. Due to the break or dip in the motor current a slightly lower mean value of the torque results, which can be easily corrected, however, by selecting a higher setpoint or nominal value for the current.

There is no longer any danger of demagnetization of the permanent-magnet rotor by current peaks. In addition, the switchable semiconductor valves are subjected to less loading. A further advantage results from the fact that the overcurrent or excess current protection need no longer be set to double the rated current, but rather, can be set simply to the rated current, thereby providing more effective protection for the direct-current motor 1 against overcurrents.

FIGS. 3a and 3b together represent a block diagram of a direct-current drive for implementing the method according to the invention. The direct-current drive shown therein includes an equivalent circuit diagram of a brushless direct-current motor 1 with a permanent-magnet rotor and three phase windings. Assigned to the direct-current motor 1, in a conventional manner, is a rotor-position sensor 6, which supplies the commutation signals determining the instants of commutation. The dc/ac current inverter 2 of the direct-current motor 1 is made up of a line-side rectifier module 8 and a load-side power stage 7. The power stage 7 is constructed in the form of a three-phase bridge with the power transistors Tr1 to Tr6 (shown in FIGS. 1a and 1b) with back-to-back or antiparallel free-wheeling diodes V1 to V6. The current in the direct-current link or intermediate circuit 5 with impressed direct voltage $U_{ZK}$ is measured in an isolated circuit, i.e. floating, by means of a current-measuring device 4 (single-current measurement in the direct-current line or intermediate circuit 5).

The digital signals from the rotor-position sensor serve as the actual value of the rotational speed and are converted into an analog voltage by the rotational-speed actual-value conditioner or digital-to-analog (D/A) converter 9. Because no external tachometer is required for measuring the actual value of the rotational speed, a very low-cost construction is offered. The rotational-speed setpoint is provided by the setpoint selector 10. The rotational speed is regulated in a conventional manner by means of a rotational-speed controller 11 (usually a PI controller), a current limiter 12 and an absolute-value generator 13. The rotational-speed controller supplies the setpoint of the motor current for current regulation, which is subordinate to rotational-speed regulation.

As described hereinbefore, the actual value of the motor current is measured by means of a current-measuring device 4 in the direct-current link or intermediate circuit 5. The current controller 14 is a two-point current controller; when the actual value of the current reaches the upper limit of the hysteresis band of the current controller 14, the power transistors of the power stage 7, which are controlled or energized in accordance with signals from a control logic 15 and from a direction-of-rotation reverser 16, are switched off, and when the actual value of the current falls below the lower limit of the hysteresis band of the current controller, the power transistors of the power stage 7 are switched on again. The clock frequency of the current controller 14 is not fixed, but rather it is dependent upon the hysteresis set at the current controller 14, upon the motor inductance $L_f$ and upon the winding resistance $R_f$.

Because a positive output voltage is constantly supplied to the current controller 14 due to the absolute-value generator 13, a change of polarity is signalled via the polarity detector 19 to the direction-of-rotation reverser 16. The direction-of-rotation reverser 16 then initiates or enables an appropriate switching of the power transistors Tr1 to Tr6 to the other operating mode. A linking of the direction-of-rotation reverser 16 and the power stage 7 is effected via a driver stage 17.

An electronic control 18 receives the commutation signals from the rotor-position sensor 6, the rotational-speed setpoint from the setpoint selector 10 and the information on the operating mode from the polarity detector 19 as input signals. In the electronic control 18, the blocking time $t_s$ of the current controller 14 is determined in the aforedescribed manner by means of the information and by means of the stored current-buildup and current-decay characteristics. A block 20 is set by a blocking signal corresponding to the duration of the blocking time $t_s$. With the setting of the block 20, the current controller 14 is blocked and, accordingly, all of the power transistors Tr1 to Tr6 are switched off.

FIG. 4a is a flow chart for a program of the electronic control 18 for activating the block 20. At 21, the program is started with the arrival of a commutation signal from the rotor-position sensor 6. At 22, the block is set and, simultaneously, an internal timer is started. With the signal from the polarity detector 19, the direction of rotation of the direct-current motor 1 is determined at 23. At 24, a check is made as to whether the motor is operating in motor mode or not. If this question is answered in the affirmative, a check is made at 25 as to whether the rotational speed is greater than a selected rotational speed $n_{max}$ or not. If the positive condition is satisfied, a new blocking time $t_s=0$ is set at 25a. If the positive condition at 25 is not satisfied, the blocking time $t_s$ for motor mode is computed at 26. If it were established at 24 that the operational mode is the generator mode, the blocking time $t_s$ for the generator mode is computed at 27. Then, the blocking time is stored at 28.

After the programmed blocking time has elapsed, the timer triggers an interrupt. FIG. 4b shows the processing of an interrupt for the timer. When the blocking time is completed, the block is removed at 30; the timer is reset at 31, and the timer is loaded with the newly computed blocking time at 32. Then, the main program is further executed at 33.

The foregoing is a description corresponding in substance to German Application P 40 09 184.8, dated Mar. 22, 1990, the International priority of which is being claimed for the instant application, and which is hereby made part of this application. Any material discrepancies between the foregoing specification and the aforementioned corresponding German application are to be resolved in favor of the latter.

We claim:

1. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct current link to a direct-current converter having a power stage including a multi-phase bridge with a plurality of power switches, measuring with a current measuring device an actual value of the current exclusively in the direct-current link to the direct-current converter, and delaying current buildup with respect to current decay in the phase windings for a time period $t_v$ during which time period said plurality of power switches are switched off.

2. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct current link to a direct-current converter having a power stage including a multi-phase bridge with a plurality of power switches, measuring with a current measuring device an actual value of the current exclusively in the direct-current link to the direct-current converter, initiating the current decay at an instant of time equal to the arrival of a commutation signal from the rotor-position sensor, and initiating the current buildup with a delay equal to a time period tv.

3. Method according to claim 2, which further includes the steps of selecting a blocking time $t_s$ equals the time period $t_v$ by an electronic control, and blocking a current controller during the time period $t_v=t_s$.

4. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct-current converter having a power stage including a multi-phase bridge with a plurality of power switches, measuring an actual value of the current exclusively in a direct-current link or an immediate circuit of the direct-current converter, and delaying current buildup with respect to a current decay in the phase windings for a time period $t_v$ during which said plurality of power switches are switched off, initiating the current decay at an instant of time relative to an arrival of a commutation signal from the rotor-position sensor, and initiating the current buildup with a delay of the time period tv, initiating the current decay, and wherein said instant of time falls prior to the arrival of the commutation signal from the rotor-position sensor, and initiating the current buildup with a delay of the time period tv upon the arrival of the commutation signal.

5. Method according to claim 4, which further includes the step of blocking a current controller during the time period $t_v$=blocking time $t_s$.

6. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct current link to a direct-current converter having a power stage including a multi-phase bridge with a plurality of power switches, measuring with a current measuring device an actual value of the current exclusively in the direct-current link to the direct-current converter, initiating the current decay at an instant of time defined by the arrival of a commutation signal from the rotor-position sensor, and initiating the current buildup with a delay equal to the time period tv from the arrival of the commutation signal.

7. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct-current converter having a power stage including a multi-phase bridge with a plurality of power switches, measuring in actual value of the current exclusively in a direct-current link or an immediate circuit of the direct-current converter, and delaying current buildup with respect to a current decay in the phase windings for a time period $t_v$ during which said plurality of power switches are switched off, initiating the current decay at an instant of time relative to an arrival of a commutation signal from the rotor-position sensor, initiating the current buildup with a delay of the time period $t_v$, selecting a blocking time $t_s$=the time period $t_v$ by means of an electronic control, and blocking a current controller during the time period $t_v = t_s$, and wherein the blocking time $t_s$ is constant.

8. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct-current converter having a power stage including a multi-phase bridge with a plurality of power switches, measuring an actual value of the current exclusively in a direct-current link or an immediate circuit of the direct-current convert, and delaying current buildup with respect to a current decay in the phase windings for a time period $t_v$ during which said plurality of power switches are switched off, initiating the current decay at an instant of time relative to an arrival of a commutation signal from the rotor-position sensor, initiating the current buildup with a delay of the time period tv, selecting a blocking time $t_s$=the time period $t_v$ by means of an electronic control, and blocking a current controller during the time period $t_v = t_s$, and determining the blocking time $t_s$ from current-buildup and current decay characteristics so that the current buildup and the current decay are completed substantially simultaneously.

9. Method according to claim 8, which further includes the step of maintaining the current controller in unblocked condition above a given rotational speed in a motor mode.

10. Method for suppressing current peaks occurring during commutation in phase windings of a brushless direct-current motor having a motor shaft, a rotor-position sensor connected to the motor shaft, the method which comprises the steps of supplying the phase windings with rectangular current via a direct-current converter having a power stage including a multi-phase bridge with a plurality of power switches, measuring an actual value of the current exclusively in a direct-current link or an immediate circuit of the direct-current converter, and delaying current buildup with respect to a current decay in the phase windings for a time period $t_v$ during which said plurality of power switches are switched off, initiating the current decay at an instant of time relative to an arrival of a commutation signal from the rotor-position sensor, initiating the current buildup with a delay of the time period tv, initiating the current decay, wherein said instant of time is defined by arrival of a commutation signal from the rotor-position sensor, blocking the converter upon the arrival of the commutation signal, and initiating commutation when the motor current reaches a minimum $I_{min}$.

* * * * *